(12) United States Patent
Yoshioka et al.

(10) Patent No.: US 7,443,080 B2
(45) Date of Patent: Oct. 28, 2008

(54) LAMINATED PIEZOELECTRIC/ELECTROSTRICTIVE DEVICE

(75) Inventors: Kunihiko Yoshioka, Nagoya (JP); Makoto Ohmori, Nagoya (JP); Akihiko Honda, Nagoya (JP); Koji Kimura, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 86 days.

(21) Appl. No.: 11/554,669

(22) Filed: Oct. 31, 2006

(65) Prior Publication Data

US 2007/0170818 A1 Jul. 26, 2007

(30) Foreign Application Priority Data

Jan. 23, 2006 (JP) .............................. 2006-013593

(51) Int. Cl.
*H01L 41/08* (2006.01)
(52) U.S. Cl. ....................................... 310/328; 310/366
(58) Field of Classification Search ................. 310/328, 310/358, 359, 366
See application file for complete search history.

(56) References Cited

U.S. PATENT DOCUMENTS

| | | | | |
|---|---|---|---|---|
| 5,089,739 A | * | 2/1992 | Takahashi et al. ........... | 310/328 |
| 5,118,982 A | * | 6/1992 | Inoue et al. .................. | 310/366 |
| 5,237,239 A | * | 8/1993 | Inoue et al. .................. | 310/328 |
| 5,438,232 A | * | 8/1995 | Inoue et al. .................. | 310/328 |
| 6,888,290 B2 | * | 5/2005 | Murai et al. ................. | 310/328 |
| 2005/0168106 A1 | | 8/2005 | Iwase et al. | |

FOREIGN PATENT DOCUMENTS

| | | |
|---|---|---|
| JP | 06-164009 A1 | 6/1994 |
| JP | 2001-102647 A1 | 4/2001 |
| JP | 2002-160195 A1 | 6/2002 |
| JP | 2002-314161 A1 | 10/2002 |
| JP | 2003-017779 A1 | 1/2003 |
| JP | 2005-223013 A1 | 8/2005 |

\* cited by examiner

*Primary Examiner*—Mark Budd
(74) *Attorney, Agent, or Firm*—Burr & Brown

(57) ABSTRACT

There is realized a piezoelectric/electrostrictive device of a laminated type from which a large displacement is obtained and which is highly reliable over a long period. A laminated piezoelectric/electrostrictive device 1 has: a laminated columnar article 10 constituted by alternately laminating a plurality of piezoelectric/electrostrictive layers 14 and inner electrode layers 18, 19; and a pair of outer electrodes 28, 29 disposed on a peripheral surface of the laminated columnar article 10 to connect layers having the same polarity to each other among the inner electrode layers 18, 19. This laminated piezoelectric/electrostrictive device 1 is characterized in that interfaces 2*a*, 2*b* having a relatively low interface strength as compared with the other interfaces are disposed at a specific interval among the interfaces between layers of the laminated columnar article 10.

15 Claims, 7 Drawing Sheets

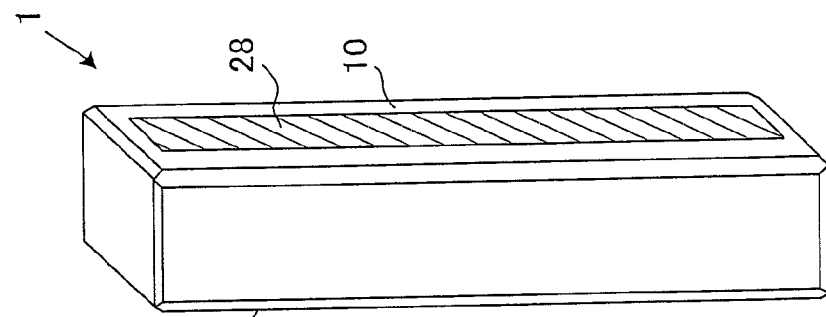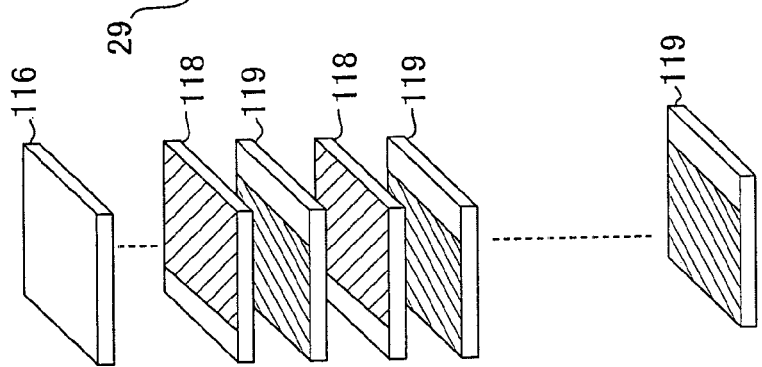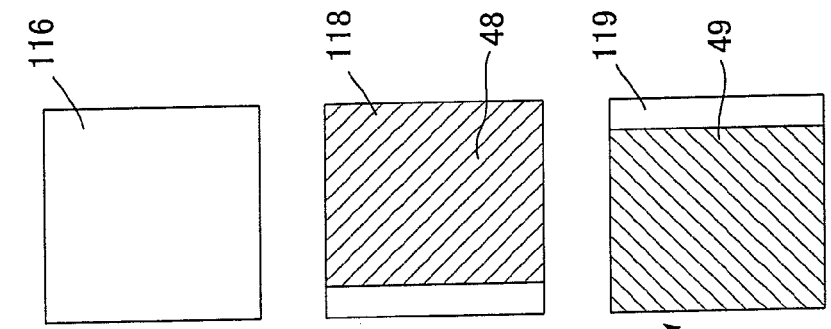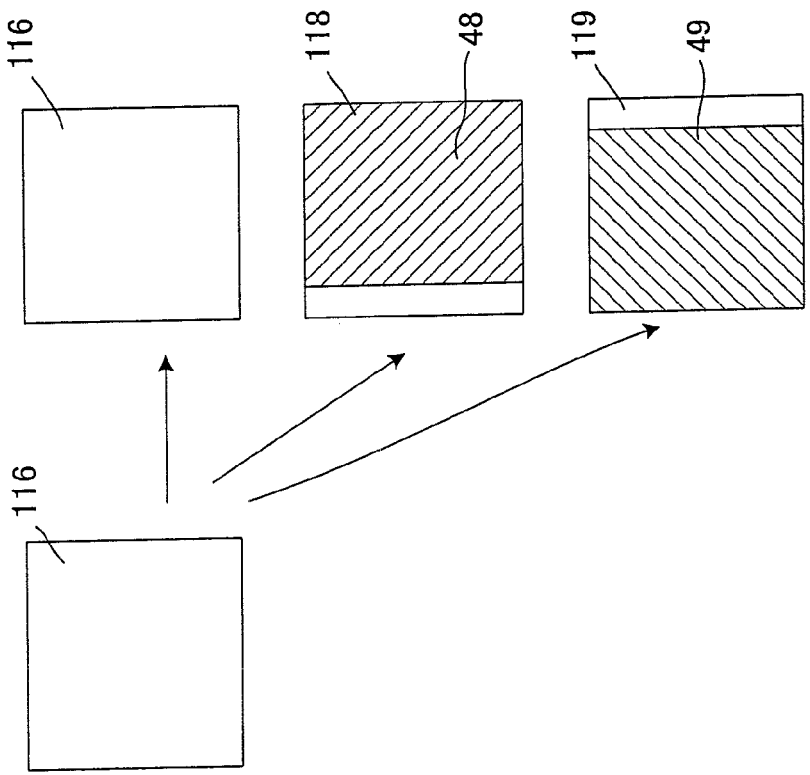

LAMINATED PIEZOELECTRIC/ELECTROSTRICTIVE DEVICE

BACKGROUND OF THE INVENTION

1. Field of the Invention

The present invention relates to a laminated piezoelectric/electrostrictive device which is excellent in durability and which is drivable over a long period.

2. Description of the Related Art

To solve a global warming problem as one of global environmental problems, a technology to reduce fuel consumption of an automobile has been advanced. As an eco-friendly power source of the automobile, a fuel cell is regarded as effective, but there are many technical problems and cost problems in realizing such a fuel cell. To solve the problem, a hybrid engine system in which an electric motor is used together has been increasingly put to practical use. Especially in Europe, an automobile on which an improved diesel engine having emissions of harmful substances suppressed is mounted largely increases its share.

The diesel engine is an engine in which a fuel is jetted into a cylinder and compressed at a high pressure to self-ignite, and an engine output is controlled in accordance with an amount of the fuel to be jetted. Therefore, in the diesel engine, a function of a fuel jet device which feeds the fuel into the cylinder is important. In recent years, a reason why the use of the diesel engine increases largely lies in development of a so-called common rail type fuel jet device. Especially in the future, it is expected that enlargement of the use of the diesel engine is supported by employing a piezoelectric device as the driving source of a mechanism for opening or closing a jet nozzle, instead of a solenoid. This is because the piezoelectric device can realize the opening/closing of the jet nozzle at a higher speed and with a higher precision as compared with the solenoid, and a more appropriate amount of the fuel can be fed into the cylinder at a more appropriate timing to form an optimum combustion state of the fuel. As a result, it is considered that excellent effects are brought about such as reduction of harmful substances such as particulates, nitrogen oxide, carbon monoxide and hydrocarbons included in an exhaust gas, the reduction of the fuel consumption, turning-down of an engine sound and enhancement of the engine output.

In many cases, as the piezoelectric device to be applied, to the fuel jet device, as the driving source (micro actuator to open or close the nozzle) of the opening/closing mechanism of the jet nozzle, a laminated type of piezoelectric device is employed because a displacement amount can be enlarged. This laminated type of piezoelectric device in general has a structure in which a pair of outer electrodes connecting inner electrodes having the same polarity to each other are formed on a peripheral surface of a laminated article constituted by laminating a plurality of layered piezoelectric articles and inner electrodes.

To prevent a shortcircuit from being caused, such a laminated type of piezoelectric device takes any of the following configurations in many cases. In a first configuration, in principle, the piezoelectric articles and the inner electrodes having an equal size are laminated, but in a place in the vicinity of the peripheral surface where one inner electrode is connected to one outer electrode, another inner electrode having a different polarity is laminated so as to be retracted in the laminated article so that the other inner electrode does not appear on the peripheral surface of the laminated article. Similarly, in a place in the vicinity of the peripheral surface where the other inner electrode is connected to another outer electrode, the one inner electrode having the polarity different from that of the other inner electrode is laminated so as to be retracted in the laminated article so that the one inner electrode does not appear on the peripheral surface of the laminated article. In a second configuration, in principle, all the inner electrodes which are smaller than the piezoelectric article are laminated so as to be retracted in the laminated article so that the inner electrodes do not appear on the peripheral surface of the laminated article. In a place where one inner electrode is connected to one outer electrode, however, the one inner electrode appears on the peripheral surface of the laminated article and is connected to the one outer electrode. In another place, another inner electrode is similarly connected to another outer electrode. It is to be noted that examples of prior documents on the laminated type of piezoelectric device include Patent Documents 1 to 3.

[Patent Document 1] Japanese Patent Application Laid-Open No. 2005-223013

[Patent Document 2] Japanese Patent Application Laid-Open No. 2001-102647

[Patent Document 3] Japanese Patent Application Laid-Open No. 6-164009

[Patent Document 4] Japanese Patent Application Laid-Open No. 2002-160195

In any of the above-described configurations of the laminated type of piezoelectric device, in the place where one inner electrode is connected to the outer electrode, any inner electrode is not disposed in one of a lower layer and an upper layer of the portion between which the piezoelectric article is sandwiched. Therefore, the portion is an inactive portion in which any displacement is not generated in the piezoelectric article. Therefore, in response to the displacement generated in an active portion of the piezoelectric article sandwiched between the inner electrodes, a large stress is generated in the inactive portion, or the stress is concentrated on a boundary between the active portion and the inactive portion. Therefore, when the laminated type of piezoelectric device is used over a long period, cracks are generated in the piezoelectric article owing to the stress concentration to deteriorate a performance, and a shortcircuit is caused between the inner electrodes owing to the generation of the cracks. The device cannot be driven in some case.

Especially, when a large displacement amount is required as in the piezoelectric device to be applied as the driving source of the opening/closing mechanism of the jet nozzle in the fuel jet device of the diesel engine, in order to obtain a desired displacement amount, the number of the laminated piezoelectric articles and the number of the laminated inner electrodes are large in the laminated type of piezoelectric device. In such a laminated type of piezoelectric device, the stress necessarily enlarges, and many inactive portions are present. Therefore, it has been difficult to realize the laminated type of piezoelectric device having both a high durability and a high performance.

SUMMARY OF THE INVENTION

The present invention has been developed in view of the above-described conventional technical problems, and an object is to provide a laminated piezoelectric device capable of obtaining a large displacement amount and retaining a high reliability over a long period. As a result of repeated investigations, it has been found that the above object can be achieved by the following means.

That is, according to the present invention, there is first provided a laminated piezoelectric/electrostrictive device having: a laminated columnar article constituted by alternately laminating a plurality of piezoelectric/electrostrictive layers and inner electrode layers; and a pair of outer electrodes disposed on a peripheral surface of the laminated columnar article, each of the outer electrodes being configured to connect the inner electrode layers having the same polarity to each other among the plurality of inner electrode layers, wherein among interfaces between layers of the laminated columnar article, interfaces (also referred to simply as the weak interfaces) having a relatively low interface strength as compared with the other interfaces are arranged at a specific interval.

In general, the interface refers to a boundary surface on which two phases come into contact with each other. Therefore, the interface between the layers of the laminated columnar article of the laminated piezoelectric/electrostrictive device of the present invention is in principle formed of the piezoelectric/electrostrictive layer (phase mainly constituted of a piezoelectric/electrostrictive material, a layered piezoelectric/electrostrictive article) and the inner electrode layer (phase constituted of a conductive material, a layered inner electrode). In an inactive portion where any inner electrode layer is not present in a laminating direction, the interface is sometimes formed of the piezoelectric/electrostrictive layers. The interface strength mentioned in the present specification is evaluated based on a bending strength test method of a fine ceramic defined in R1601 of Japanese Industrial Standards (JIS). This standard of R1601 is used for measuring a breaking strength of the piezoelectric/electrostrictive material (piezoelectric/electrostrictive layer). It is assumed that in a case where the interface strength mentioned in the present specification is measured, however, the interface is disposed on a test piece, and a normal of the interface meets a length direction of the test piece. Moreover, a test is conducted using the test piece by the test method defined in the standard of R1601, and it is confirmed that a broken portion is the interface (of a measurement object). Furthermore, the bending strength calculated based on a breaking load obtained by the test is regarded as the interface strength.

In the laminated piezoelectric/electrostrictive device of the present invention, it is preferable that the specific interval satisfies the following equations (1) and (2):

$$n < \frac{1}{t} \cdot \ln\left(\frac{\sigma_{2\min}}{2 \cdot \sigma_{2\min} - \sigma_f}\right) \quad (1)$$

and $$\sigma_{2\min} = \frac{E \cdot d_{33} \cdot V}{2t} \quad (2)$$

in which t is a thickness (μm) of one of the piezoelectric/electrostrictive layers. In Equation (1), n is the number of the piezoelectric/electrostrictive layers which are present in the specific interval, l is a thickness (μm) of the laminated columnar article, and $\sigma_f$ is a breaking strength (MPa) of one block present in the specific interval. In Equation (2), E is the Young's modulus (MPa) of a piezoelectric/electrostrictive material constituting the piezoelectric/electrostrictive layers, $d_{33}$ is a piezoelectric/electrostrictive constant (μm/V) of the piezoelectric/electrostrictive material constituting the piezoelectric/electrostrictive layers, and V is an applied voltage (V), respectively. The thickness t of the one piezoelectric/electrostrictive layer and the thickness l of the laminated columnar article are constant. The block is a portion sandwiched between two interfaces having the relatively low interface strength in the laminated piezoelectric/electrostrictive device, or a portion on the uppermost or lowermost side of one interface having the relatively low interface strength on the uppermost or lowermost side of the laminated piezoelectric/electrostrictive device. Moreover, the piezoelectric/electrostrictive layer is a layer sandwiched between the inner electrode layers, that is, having an active portion. That is, in a case where in an end portion of the laminated piezoelectric/electrostrictive device or the like, there is disposed a layer which is not sandwiched between the inner electrode layers, that is, a layer which is constituted of a piezoelectric/electrostrictive material and which does not have any active portion, the layer is not regarded as the piezoelectric/electrostrictive layer. It is to be noted that the breaking strength is the bending strength evaluated by the bending strength test method of the fine ceramic defined by R1601 of Japanese Industrial Standards (JIS).

The laminated piezoelectric/electrostrictive device in which the specific interval satisfies Equations (1) and (2) means that the number n of the piezoelectric/electrostrictive layers sandwiched between two interfaces arranged at the specific interval and having the relatively low interface strength satisfies Equations (1) and (2). It is to be noted that in the present specification, as described above, the portion sandwiched between two interfaces of the laminated piezoelectric/electrostrictive device having the relatively low interface strength, or the portion on the uppermost or lowermost side of one interface having the relatively low interface strength on the uppermost or lowermost side of the laminated piezoelectric/electrostrictive device is referred to as the block (referred to as one block, if one block is present). Therefore, the interfaces included in one block are only interfaces (also referred to simply as the strong interfaces) having a relatively high interface strength. The thickness of the laminated columnar article of the laminated piezoelectric/electrostrictive device is a length of one side of a square in a case where a section of the laminated columnar article which is perpendicular to an axial direction is the square. Similarly, the thickness is a length of a long side of a rectangle in a case where the section is the rectangle. Similarly, the thickness is a diameter of a circle in a case where the section is the circle. Furthermore, the breaking strength $\sigma_f$ is a stress at a time when one block is broken by the bending strength test method. That is, the breaking strength $\sigma_f$ corresponds to the bending strength of the piezoelectric/electrostrictive layers in a case where cracks are generated in the piezoelectric/electrostrictive layers (phase constituted of the piezoelectric/electrostrictive material) in the laminated piezoelectric/electrostrictive device. The breaking strength corresponds to the interface strength in a case where the cracks are generated in the strong interfaces (between the piezoelectric/electrostrictive layers or between the piezoelectric/electrostrictive layer and the inner electrode layer).

In the laminated piezoelectric/electrostrictive device of the present invention, it is preferable that in a case where a portion having a relatively high interface strength and a portion having a relatively low interface strength are further present in the interface having a relatively low interface strength as compared with the other interfaces, the portion having the relatively low interface strength is disposed from a portion provided with the inner electrode layer to an inner portion of the piezoelectric/electrostrictive layer on the side of the peripheral surface of the laminated piezoelectric/electrostrictive device.

Moreover, in the laminated piezoelectric/electrostrictive device of the present invention, it is preferable that among the piezoelectric/electrostrictive layers and the inner electrode layers constituting the laminated columnar article, a density of a part of the piezoelectric/electrostrictive layers or the inner electrode layers is smaller than that of the other piezoelectric/electrostrictive layers or the other inner electrode layers, and the interfaces having the relatively low interface strength as compared with the other interfaces are formed from the piezoelectric/electrostrictive layers or the inner electrode layers having the small density.

Furthermore, in the laminated piezoelectric/electrostrictive device of the present invention, it is preferable that a part of the inner electrode layers constituting the laminated columnar article is formed of a material of only metals, the other inner electrode layers are formed of a cermet material, and the interfaces having the relatively low interface strength as compared with the other interfaces are formed from the inner electrode layers formed of the material of the only metal.

There is not any restriction on the laminated piezoelectric/electrostrictive device of the present invention, but it is preferable that the device is prepared using a green sheet laminating method. Specifically, it is preferable that the laminated piezoelectric/electrostrictive device of the present invention is prepared by the steps of: forming electrode patterns constituted of a conductive material and constituting later the inner electrode layers on a plurality of green sheets mainly composed of the piezoelectric/electrostrictive material and constituting the piezoelectric/electrostrictive layers later: laminating the plurality of green sheets having the electrode patterns formed thereon to obtain a laminated green article; and firing the laminated green article to obtain the laminated columnar article. In this case, it is preferable that the laminated green article is obtained using a punching machine, and the green sheets having the electrode patterns formed thereon are punched while laminating the green sheets on a punch as a laminating shaft of the punching machine. Moreover, in a case where there is performed the step of obtaining the laminated green article in this manner, and firing the laminated green article to obtain the laminated columnar article, in the laminated piezoelectric/electrostrictive device of the present invention, it is preferable that when the green sheets having the electrode patterns formed thereon are laminated, a bonding strength between a part of the green sheets (unfired) is set to be lower than that between the other green sheets (unfired), and the interface having the relatively low interface strength as compared with the other interfaces is constituted by the interface between the green sheets between which the bonding strength has been set to be low.

It is preferable that the laminated piezoelectric/electrostrictive device of the present invention is prepared using the green sheet laminating method which is different from the above method in that a fire timing is changed. Specifically, it is preferable that the laminated piezoelectric/electrostrictive device of the present invention is prepared by the steps of: repeatedly forming an electrode pattern constituted of a conductive material and constituting later the inner electrode layer on a green sheet mainly composed of a piezoelectric/electrostrictive material and constituting the piezoelectric/electrostrictive layer later, laminating a new green sheet on the green sheet having the electrode pattern formed thereon, and forming an electrode pattern on the newly laminated green sheet; and firing the green sheets at an arbitrary timing a plurality of times to obtain the laminated columnar article. In this case, in the laminated piezoelectric/electrostrictive device of the present invention, it is preferable that a firing temperature of a part of the firing performed the plurality of times is set to be lower than that of the other firing, or a firing time of a part of the firing is set to be shorter than that of the other firing, and the interfaces having the relatively low interface strength as compared with the other interfaces are formed from the piezoelectric/electrostrictive layers or the inner electrode layers which are not sufficiently sintered owing to the firing at the lowered firing temperature or in the reduced firing time. The firing is performed at the arbitrary timing. The green sheet may be fired before the electrode pattern constituted of the conductive material is formed, every time the electrode pattern is formed on the green sheet (patterning is performed), or after the laminating of the green sheet and the patterning are repeated the constant number of the times. It is to be noted that the green sheet laminating method as such is means known, the details of the method will be described in the present specification, and procedures and contents disclosed in, for example, Patent Document 4 may be referred.

It is preferable that the laminated piezoelectric/electrostrictive device of the present invention is prepared using, as the piezoelectric/electrostrictive material or the conductive material, at least two types of piezoelectric/electrostrictive materials or conductive materials different from each other in sintering temperature or sintering time regardless of the firing timing. The interfaces having the relatively low interface strength as compared with the other interfaces are formed from the piezoelectric/electrostrictive layers or the inner electrode layers constituted by firing the green sheets or the electrode patterns mainly composed of the piezoelectric/electrostrictive material or conductive material having a high sintering temperature or a long sintering time in the at least two types of piezoelectric/electrostrictive materials or conductive materials.

In the laminated piezoelectric/electrostrictive device of the present invention, it is preferable that cracks are generated in an interfacial direction in the interfaces having the relatively low interface strength as compared with the other interfaces, in a case where the device is polarized or operated. The interfacial direction means a direction along the interfaces, and the direction is substantially perpendicular to the laminating direction.

In the laminated piezoelectric/electrostrictive device of the present invention, it is preferable that the laminated columnar article has a regular square pole shape formed by chamfering corners of the peripheral surface of the laminated columnar article.

The laminated piezoelectric/electrostrictive device of the present invention is preferably used as a driving source of a jet nozzle opening/closing mechanism in a fuel jet device of an internal combustion engine.

In the laminated piezoelectric/electrostrictive device of the present invention, it is preferable that the direction in which the piezoelectric/electrostrictive layers and the inner electrode layers are laminated is the same direction as the axial direction of the laminated columnar article (the directions are parallel to each other), and a displacement generated in the piezoelectric/electrostrictive layer is an expansion/contraction displacement based on a longitudinal effect of an electric field induced strain.

In addition, the laminated piezoelectric/electrostrictive device of the present invention is referred to as being piezoelectric/electrostrictive, but the displacement generated in the piezoelectric/electrostrictive layer includes all displacements based on the strain induced by an electric field. That is, the laminated piezoelectric/electrostrictive device of the present invention is not limited to a device which utilizes an inverse piezoelectric/electrostrictive effect to generate an amount of the strain substantially proportional to an applied field, or a device which utilizes an electrostrictive effect to generate an amount of the strain substantially proportional to a square of the applied field in a narrow sense. The device includes a device which utilizes a phenomenon such as polarization reverse seen in a general ferroelectric material or antiferroelectric phase-ferroelectric phase transition seen in an antiferroelectric material.

In the laminated piezoelectric/electrostrictive device of the present invention, among the interfaces between the layers of the laminated columnar article, the interfaces having the relatively low interface strength as compared with the other interfaces are arranged at the specific interval. Therefore, in a case where the device is driven or polarized, when a large stress is generated in the device, the cracks can be induced so as to be generated in the interfaces having the relatively low interface strength (generated in the interfacial direction). Since the cracks are induced to be generated in the interfacial direction, an inner stress disconnects and becomes discontinuous in at least the laminating direction (thickness direction of the piezoelectric/electrostrictive layer) of the laminated columnar article. The stress is not large unlike a case where the stress is continuous. In the laminated piezoelectric/electrostrictive device of the present invention, cracks which break the piezoelectric/electrostrictive layer or cracks which range across the piezoelectric/electrostrictive layer are not easily generated. When the cracks are generated across the piezoelectric/electrostrictive layer, the device cannot function owing to breakdown. However, since the cracks generated in the interfacial direction in the interface do not hamper the function of the piezoelectric/electrostrictive device, the performance of the device is inhibited from being deteriorated by use over the long period, and impossibility of driving due to a shortcircuit does not easily occur.

In the laminated piezoelectric/electrostrictive device of the present invention, even in a case where the total number of the piezoelectric/electrostrictive layers is increased, when the cracks are generated in the interfacial direction (in other words, between the layers), the inner stress can be prevented from being increased. In a case where the number of the layers is small, since the strain is shared by the active portion and the inactive portion, the stress is reduced. When the number of the layers increases, however, the inactive portion undergoes a greater part of the strain, and a large stress is generated in the inactive portion. When the cracks are generated in the interfacial direction (between the layers), continuity of a structure is broken, and a plurality of blocks having the small number of the layers are connected to one another. That is, when the number of the layers is small, the stress is distributed in an only region closest to a boundary between the inactive portion and the active portion. Therefore, a volume of the active portion concerned with the stress distribution is substantially equal to that of the inactive portion concerned with the stress distribution. On the other hand, in a case where the number of the layers is large, since the stress is distributed from the boundary between the inactive portion and the active portion to a region distant from the boundary, the volume of the active portion concerned with the stress distribution becomes larger than that of the inactive portion concerned with the stress distribution, and a large strain is generated in the inactive portion.

In the laminated piezoelectric/electrostrictive device or the actuator described in Patent Documents 1 to 3, a stress relaxing portion (Patent Document 1), an insulating article (Patent Document 2) or an adhesive layer (Patent Document 3) works as a buffer material or an absorption material to relax or absorb the stress, and prevents the cracks from being generated. Therefore, when the cracks are once generated owing to the inner stress, the presence of each member that works as the buffer material or the absorption material might be a factor for the generation of the cracks which break the piezoelectric/electrostrictive layers or which range across the layers. When the cracks are generated in the boundary between the inactive portion and the active portion of a certain layer, the stress of a distant end of the boundary is isotropically generated, and a development direction of the cracks cannot be specified. Therefore, in these devices or actuators, when a force in excess of a capability of buffering or absorbing the stress works, the driving might be impossible. According to the laminated piezoelectric/electrostrictive device of the present invention, however, such a problem does not occur. This is because the laminated piezoelectric/electrostrictive device of the present invention does not originally buffer or absorb the stress, and the device induces the development direction of the cracks which could be generated owing to the stress toward a predetermined interface to control the cracks. The laminated piezoelectric/electrostrictive device of the present invention can stably operate for the long period even while the cracks are generated. It can be said that the piezoelectric/electrostrictive device is highly reliable over the long period, and has a high durability.

According to the preferable mode of the laminated piezoelectric/electrostrictive device in the present invention, the specific interval satisfies Equations (1) and (2) described above, and is conditioned by these equations represented by a ratio between a portion in which the expansion/contraction displacement is generated and a portion in which any expansion/contraction displacement is not generated, the thickness of the piezoelectric/electrostrictive layer, the Young's modulus of the piezoelectric/electrostrictive material constituting the piezoelectric/electrostrictive layers and the like. Moreover, there is a restriction on the maximum number of the piezoelectric/electrostrictive layers of one block. Therefore, the cracks are not easily generated in the interfaces present in one block and having the relatively high interface strength, and are easily generated in the interfacial direction in the only interfaces that determine the block and that have the relatively low interface strength. Therefore, regardless of the whole number of the laminated piezoelectric/electrostrictive layers of the laminated piezoelectric/electrostrictive device, the cracks which break the piezoelectric/electrostrictive layers or which range across the piezoelectric/electrostrictive layers can be prevented from being generated. That is, according to the present invention, even in the piezoelectric/electrostrictive device having the large number of the laminated piezoelectric/electrostrictive layers requiring a large displacement amount, a high reliability over the long period is secured. It is possible to realize the laminated piezoelectric/electrostrictive device having both the high durability and a high performance.

According to the preferable mode of the laminated piezoelectric/electrostrictive device in the present invention, in a case where in the interfaces having the relatively low interface strength as compared with the other interfaces, there are further the portion having the relatively high interface strength and the portion having the relatively low interface strength, the portion having the relatively low interface strength is disposed from the portion provided with the inner electrode layer to the inner side of the piezoelectric/electrostrictive layer on the side of the peripheral surface of the laminated piezoelectric/electrostrictive device. In this mode, the boundary between the portion having the high interface strength and the portion having the low interface strength deviates from the boundary between the inactive portion and the active portion of the laminated piezoelectric/electrostrictive device. The former means a boundary on which the stress is concentrated owing to a difference in interface strength, and the latter means a boundary on which the stress is concentrated owing to the strain caused by extension of the active portion. Therefore, in a case where these positions are displaced to scatter the stress, even when in the continuous interface, there are the portion having the high interface strength and the portion having the low interface strength, the cracks which break the piezoelectric/electrostrictive layers or which range across the layers are not easily generated owing to the inner stress.

In the laminated piezoelectric/electrostrictive device disclosed in Patent Document 1, as described in claim 1, the stress relaxing portion is superimposed on a reserved portion of the inner electrode layer in the laminating direction. Therefore, a boundary in which the interface strength changes meets the boundary between the inactive portion and the active portion of the laminated piezoelectric/electrostrictive device. When the cracks are once generated owing to the inner stress, there might be generated the cracks which break the piezoelectric/electrostrictive layers or which range across the layers. Therefore, when the force in excess of the capability of buffering the stress works in this device, the driving might become impossible. According to the laminated piezoelectric/electrostrictive device of the present invention, however, such a problem can be avoided. This is because as described above, the laminated piezoelectric/electrostrictive device of the present invention does not originally buffer or absorb any stress, and controls the development direction of the cracks which could be generated owing to the stress.

In the laminated piezoelectric actuator described in Patent Document 3, since a layer (adhesive layer) having a small elastic modulus is disposed, it is difficult to design the actuator so as to increase a generation force (force by which the actuator pushes an object such as a valve of a fuel jet nozzle) which is an important original characteristic of the actuator. Moreover, since a structure of the actuator is complicated, manufacturing steps increase, and manufacturing costs easily rise. According to the laminated piezoelectric/electrostrictive device of the present invention, however, such a problem does not occur. This is because the laminated piezoelectric/electrostrictive device of the present invention does not have any layer having the small elastic modulus, and can easily be prepared by the green sheet laminating method.

In the fuel jet device in which the laminated piezoelectric/electrostrictive device of the present invention is employed as the driving source for operating the opening/closing mechanism of the jet nozzle, high-speed opening/closing of the jet nozzle can be realized stably over the long period without making the driving impossible. Therefore, in the fuel jet device in which the laminated piezoelectric/electrostrictive device of the present invention is employed, an optimum amount of the fuel can be fed into a cylinder in accordance with an operating situation of the internal combustion engine including a diesel engine. Harmful substances such as particulates, nitrogen oxide, carbon monoxide and hydrocarbons included in an exhaust gas of the internal combustion engine are reduced, fuel consumption is reduced, an engine sound is turned down and an engine output is enhanced. Such excellent effects are stably brought about to the engine over the long period.

BRIEF DESCRIPTION OF THE DRAWINGS

FIGS. 10(a) to 10(d) are explanatory views showing one example of manufacturing steps of the laminated piezoelectric/electrostrictive device in the present invention;

DESCRIPTION OF THE PREFERRED EMBODIMENTS

Figure 1:
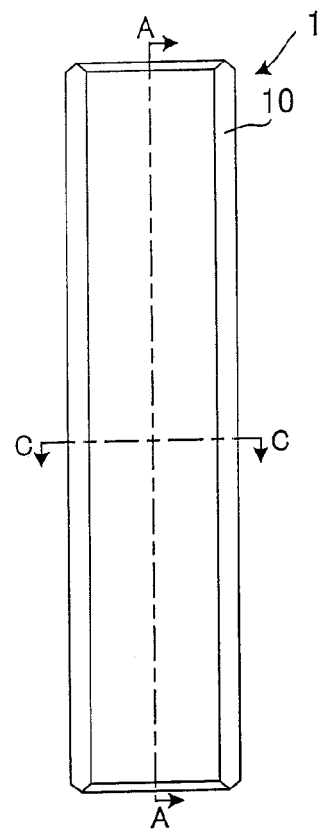
FIG. 1 is a diagram showing one embodiment of a laminated piezoelectric/electrostrictive device in the present invention, and a side view showing a peripheral surface of the laminated piezoelectric/electrostrictive device on which any outer electrode is not formed.

The present invention will appropriately be described hereinafter in accordance with embodiments with reference to the drawings, but it should not be interpreted that the present invention is limited to these embodiments. The present invention can variously be altered, modified, improved and replaced based on knowledge of a person skilled in the art without impairing the scope of the present invention. For example, the drawings show preferable modes for carrying out the present invention, but the present invention is not limited to any mode or information shown in the drawings. When the present invention is carried out or verified, means similar or equivalent to those described in the present specification can be applied, but the preferable means will be described hereinafter.

Figure 2:
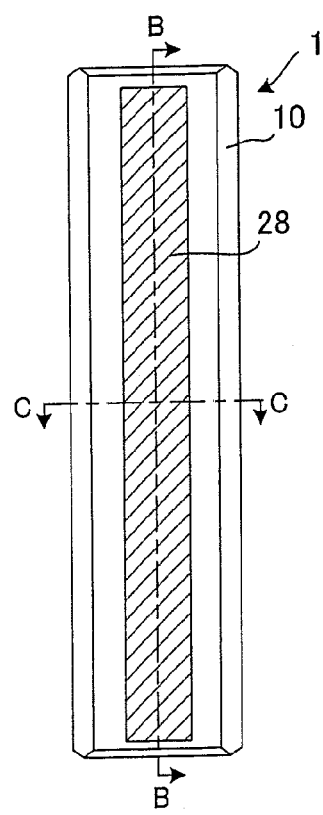
FIG. 2 is a diagram showing one embodiment of the laminated piezoelectric/electrostrictive device in the present invention, and a side view showing a peripheral surface of the device on which an outer electrode is formed.
Figure 3:
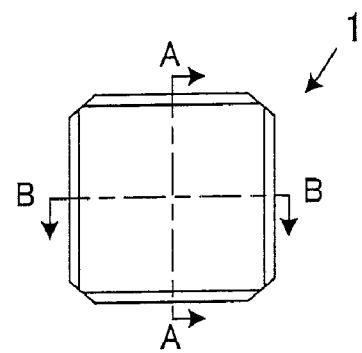
FIG. 3 is a top plan view showing one embodiment of the laminated piezoelectric/electrostrictive device in the present invention.
Figure 4:
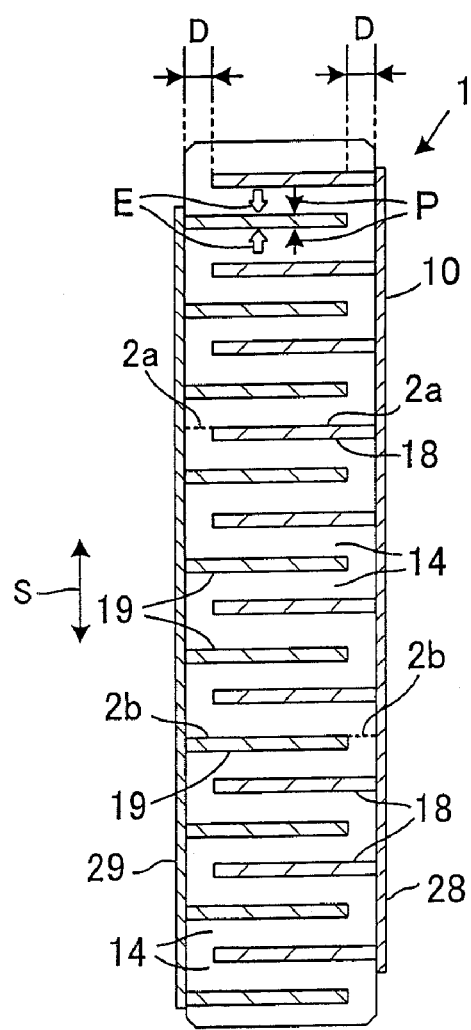
FIG. 4 is a sectional view cut along the B-B line of FIGS. 2 and 3.
Figure 5:
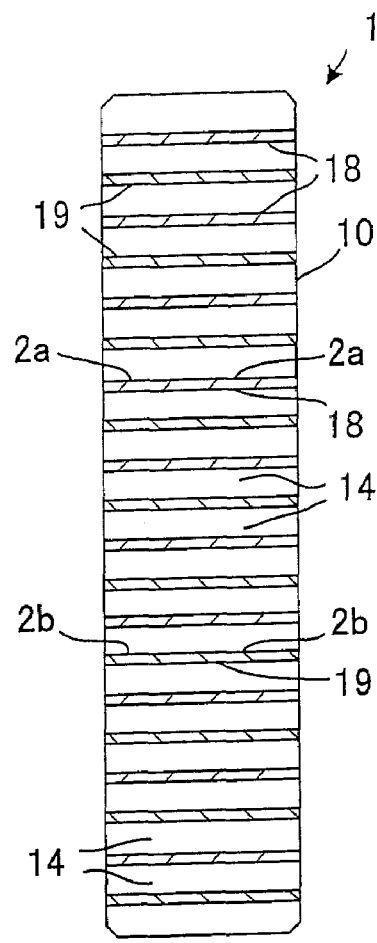
FIG. 5 is a sectional view cut along the A-A line of FIGS. 1 and 3.
Figure 6:
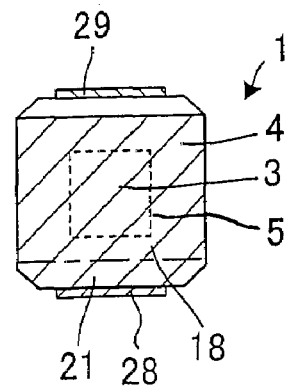
FIG. 6 is a sectional view cut along the C-C line of FIGS. 1 and 2 and showing a surface including one inner electrode layer.
Figure 7:
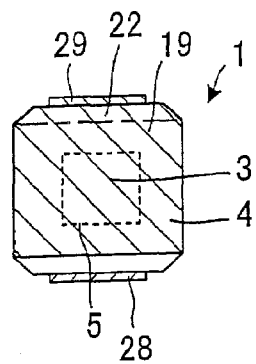
FIG. 7 is a sectional view cut along the C-C line of FIGS. 1 and 2 and showing a surface including another inner electrode layer having a polarity different from that of the one inner electrode layer shown in FIG. 6.

First, a laminated piezoelectric/electrostrictive device of the present invention will be described. FIGS. 1 to 7 show one embodiment of the laminated piezoelectric/electrostrictive device in the present invention. FIG. 1 is a side view showing a peripheral surface of the laminated piezoelectric/electrostrictive device on which any outer electrode is not formed; FIG. 2 is a side view showing a peripheral surface of the device on which an outer electrode is formed; FIG. 3 is a top plan view; FIG. 4 is a sectional view cut along the B-B line of FIGS. 2 and 3; FIG. 5 is a sectional view cut along the A-A line of FIGS. 1 and 3; FIG. 6 is a sectional view cut along the C-C line of FIGS. 1 and 2 and showing a surface including one inner electrode layer; and FIG. 7 is a sectional view cut along the C-C line of FIGS. 1 and 2 and showing a surface including another inner electrode layer having a polarity different from that of the one inner electrode layer.

A laminated piezoelectric/electrostrictive device 1 shown in FIGS. 1 to 7 has: a laminated columnar article 10 constituted by alternately laminating a plurality of piezoelectric/electrostrictive layers 14 having a thickness of the order of several tens to several hundreds of micrometers and inner electrode layers 18, 19 having a thickness of the order of several to ten or more micrometers; and a pair of outer electrodes 28, 29 which connect the inner electrode layers 18, 19 every other layers, that is, the inner electrode layers having the same polarity to one another. The laminated columnar article 10 has a regular square pole shape formed by chamfering corners of a peripheral surface of the article, and has a height of the order of several to several tens of centimeters. The outer electrode 29 forms a pair of electrodes together with the outer electrode 28, and both the electrodes are formed on the peripheral surface of the laminated columnar article 10. The outer electrodes 28, 29 connect the inner electrode layers 18 (signal electrodes) and the inner electrode layers 19 (common electrodes) to one another, respectively. The outer electrodes have a function of a wiring line for applying a voltage between the inner electrode layers 18 and 19 by use of an external power source. The laminated columnar article 10 constituted of the piezoelectric/electrostrictive layers 14 and the inner electrode layers 18, 19 and the outer electrodes 28, 29 are integrated by firing. The outer electrodes 28, 29 are constituted of solders and metal members attached by the solders. It is to be noted that FIGS. 4 and 5 show the limited number of the layers in order to facilitate understanding, but the number of the piezoelectric/electrostrictive layers 14 sandwiched between the inner electrode layers 18 and 19 is of the order of several tens to several hundreds in the laminated piezoelectric/electrostrictive device 1.

In the laminated piezoelectric/electrostrictive device 1, a polarizing direction P (see FIG. 4) of the piezoelectric/electrostrictive layers 14 is a direction from the signal electrode (inner electrode layer 18) toward the common electrode (inner electrode layer 19). Moreover, in a case where a voltage is applied between the signal electrode and the common electrode (i.e., to the piezoelectric/electrostrictive layer 14) in a direction E (see FIG. 4) which is the same as the polarizing direction P, each of the plurality of piezoelectric/electrostrictive layers 14 is displaced to extend in an axial direction (direction shown by an arrow S in FIG. 4 (referred to as the direction S)) of the laminated columnar article 10 based on a longitudinal effect of an electric field induced strain. The layers extend as the laminated piezoelectric/electrostrictive device 1. When any voltage is not applied, and any electric field is not formed in the piezoelectric/electrostrictive layers 14, the plurality of piezoelectric/electrostrictive layers 14 contract, and they also contract as the laminated piezoelectric/electrostrictive device 1. It is to be noted that a laminating direction mentioned in the present specification is the same as the direction S (axial direction of the laminated columnar article).

In the laminated piezoelectric/electrostrictive device 1, there are active portions and inactive portions. The inactive portions of the laminated piezoelectric/electrostrictive device 1 are portions shown by widths D in FIG. 4. Moreover, in each interface between layers of the laminated columnar article 10, there are a portion formed from the piezoelectric/electrostrictive layer 14 and the inner electrode layers 18, 19 and a portion formed from the piezoelectric/electrostrictive layers 14. The interface formed from the piezoelectric/electrostrictive layers 14 where any inner electrode layer is not present in the laminating direction is an interface constituting the inactive portion in which any displacement is not generated. The portion which is other than the inactive portion shown by the width D and in which the piezoelectric/electrostrictive layer 14 is sandwiched between the inner electrode layers 18 and 19 in the laminating direction is the active portion in which the displacement is generated. In FIG. 4, the inner electrode layers 18 are exposed on the peripheral surface of the laminated columnar article 10 toward the right in the figure, and the inner electrode layers 19 are exposed on the peripheral surface of the laminated columnar article 10 toward the left in the figure. In the interfaces corresponding to the portions shown by the widths D, there are portions formed from the piezoelectric/electrostrictive layers 14 and the inner electrode layers 18, 19, but in these portions, there are only wiring line portions 21, 22 (see FIGS. 6 and 7) to be connected to the outer electrodes 28, 29. Since the portions do not include any piezoelectric/electrostrictive layer 14 sandwiched between the inner electrode layers 18 and 19, any displacement is not caused, and the portions are inactive portions.

Figure 8:
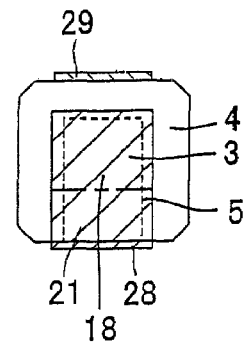
FIG. 8 is a sectional view showing the surface including the inner electrode layer having a pattern different from that of FIG. 6.
Figure 9:
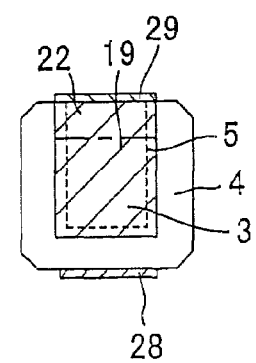
FIG. 9 is a sectional view showing the surface including the inner electrode layer having a pattern different from that of FIG. 7.

FIGS. 8 and 9 are sectional views showing the surface including the inner electrode layer, and showing the inner electrode layer having a pattern different from that shown in FIGS. 6 and 7. The inner electrode layer shown in FIGS. 8 and 9 is not exposed on the peripheral surface of the laminated columnar article 10 except sides connected to the outer electrodes 28, 29. Even in such a mode, since in the wiring line portions 21, 22, there does not exist any piezoelectric/electrostrictive layer 14 sandwiched between the inner electrode layers 18 and 19, the portions are inactive portions.

In the laminated piezoelectric/electrostrictive device 1, (for example) two interfaces having a relatively low interface strength as compared with the other interfaces are disposed among the interfaces between the layers of the laminated columnar article 10. An interval between two interfaces 2a and 2b corresponds to the specific interval mentioned in the present specification. This interval is disposed so as to satisfy Equations (1) and (2) described above. In other words, the interval between two interfaces 2a and 2b is defined so that the number n of the piezoelectric/electrostrictive layers sandwiched between the interfaces 2a and 2b satisfy Equations (1) and (2). Moreover, in a top portion of the laminated piezoelectric/electrostrictive device 1 above the interface 2a, an undersurface portion of the laminated piezoelectric/electrostrictive device 1 below the interface 2b, and a portion sandwiched between the interfaces 2a and 2b (each of the portions constitutes one block), there are only interfaces having a relatively high interface strength as compared with the interfaces 2a, 2b.

Examples of means for disposing the interfaces 2a, 2b having the relatively low interface strength as compared with the other interfaces include means for setting a density of a part of the piezoelectric/electrostrictive layers 14 or the inner electrode layers 18, 19 to be smaller than a density of the other piezoelectric/electrostrictive layers 14 or inner electrode layers 18, 19 among the piezoelectric/electrostrictive layers 14 and the inner electrode layers 18, 19 constituting the laminated columnar article 10 of the laminated piezoelectric/electrostrictive device 1 (referred to as first weak interface forming means). The interfaces formed from the piezoelectric/electrostrictive layers 14 or the inner electrode layers 18, 19 constituted of a coarse material and having a small density are the interfaces having the relatively low interface strength as compared with the other interfaces because an effective contact area of the interfaces is small. There is not any restriction on the first weak interface forming means as long as there is a difference in density of the piezoelectric/electrostrictive layers 14 or the inner electrode layers 18, 19, and means for preparing the laminated piezoelectric/electrostrictive device 1 is not limited to a green sheet laminating method. For example, in the piezoelectric/electrostrictive layer 14, when a particle size of a piezoelectric/electrostrictive material, or an amount of a pore former to be mixed with the piezoelectric/electrostrictive material so as to raise porosity is increased during preparation, the density can be reduced. The density of the inner electrode layers 18, 19 can be reduced in the same manner as in the piezoelectric/electrostrictive material.

Moreover, the examples of the means for disposing the interfaces 2a, 2b having the relatively low interface strength as compared with the other interfaces include means for changing a material of the inner electrode layer forming the interface (second weak interface forming means). For example, as a conductive material constituting the inner electrode layers forming the weak interfaces 2a, 2b, a material of an only metal is used. As a conductive material constituting the inner electrode layers forming the other strong interfaces, a cermet material is used. In this case, since ceramic components of the cermet material and components of the piezoelectric/electrostrictive layer are sintered, a bonding strength to the piezoelectric/electrostrictive layer is raised in a case where the cermet material is used as the conductive material constituting the inner electrode layer rather than a case where the material of the only metal is used. That is, according to this second weak interface forming means, it is possible to dispose the interface having the relatively high interface strength owing to the use of the cermet material and the interface having the relatively low interface strength owing to the use of the material of the only metal. Specifically, the laminated piezoelectric/electrostrictive device 1 is prepared by, for example, the steps of: forming electrode patterns constituted of the conductive material and constituting later the inner electrode layers 18, 19 on a plurality of green sheets mainly composed of the piezoelectric/electrostrictive material and constituting the piezoelectric/electrostrictive layers 14 later; laminating the plurality of green sheets having the electrode patterns formed thereon to obtain a laminated green article; and firing the laminated green article to obtain the laminated columnar article 10. Moreover, this process can be realized by employing the material of the only metal or the cermet material as the conductive material constituting the inner electrode layers 18, 19. However, this second weak interface forming means does not restrict means for preparing the laminated piezoelectric/electrostrictive device 1.

Even in a case where the conductive material constituting the inner electrode layers 18, 19 is not changed (or changed), when the green sheets having the electrode patterns formed thereon (constituting the piezoelectric/electrostrictive layers 14 later) are laminated, it is possible to dispose the interfaces 2a, 2b having the relatively low interface strength by means (referred to as third weak interface forming means) for setting the bonding strength between a part of the green sheets to be lower than that between the other green sheets. Specifically, when the green sheets (constituting the piezoelectric/electrostrictive layers 14 later) are laminated, the weak interfaces can be realized by using a material blended with the piezoelectric/electrostrictive material of the same ceramic as that of the green sheet as an adhesive, and adjusting a content of a binder in the material. During the laminating, the interface in which the adhesive containing an appropriate amount of the binder is used constitutes the interface having the relatively high interface strength, and the interface in which the adhesive including a large or small content of the binder is used constitutes the interface having the relatively low interface strength. For example, when the content of the binder is excessively large, a distance between particles of the ceramic lengthens, the material is not easily sintered, and therefore the interface strength contrarily lowers. When a blend ratio is set to be appropriate, an appropriate bonding force and sinterability can both be realized, and it is possible to form the strong interface.

Moreover, the laminated piezoelectric/electrostrictive device 1 is prepared by the steps of: repeatedly forming the electrode pattern constituted of the conductive material and constituting later the inner electrode layer 18, 19 on the green sheet mainly composed of the piezoelectric/electrostrictive material and constituting the piezoelectric/electrostrictive layer 14 later, laminating a new green sheet on the green sheet having the electrode pattern formed thereon, and forming an electrode pattern on the newly laminated green sheet; and firing the green sheets at an arbitrary timing a plurality of times to obtain the laminated columnar article 10. In this process, it is possible to dispose the interfaces 2a, 2b having the relatively low interface strength by means (referred to as fourth weak interface forming means) for setting a firing temperature of a part of the firing performed the plurality of times to be lower than that of the other firing, or setting a firing time of a part of the firing to be shorter than that of the other firing. When the firing temperature is lowered, or the firing time is shortened, the green sheets are not sintered sufficiently. Therefore, the interface formed from the piezoelectric/electrostrictive layer 14 or the inner electrode layer 18, 19 as a firing object at this time constitutes the interface having the relatively low interface strength as compared with the other interfaces.

Furthermore, the examples of the means for disposing the interfaces 2a, 2b having the relatively low interface strength as compared with the other interfaces include means (fifth weak interface forming means) using at least two types of piezoelectric/electrostrictive materials which are different from each other in sintering temperature or sintering time (time required for the sintering) as the piezoelectric/electrostrictive material of the green sheets regardless of a firing timing to fire the materials at a constant temperature for a constant time. In the two types of piezoelectric/electrostrictive materials different from each other in the sintering temperature or time, the green sheets mainly composed of the piezoelectric/electrostrictive material having a higher sintering temperature or a longer sintering time are not sufficiently sintered. Therefore, the interfaces formed of the piezoelectric/electrostrictive layers 14 obtained by firing the green sheets constitute the interfaces having the relatively low interface strength as compared with the other interfaces.

In the laminated piezoelectric/electrostrictive device 1, there are further portions (referred to as the strong interface portions) having the relatively high interface strength and portions (referred to as the weak interface portions) having the low interface strength in two weak interfaces 2a, 2b which partition the device into three blocks. Moreover, the weak interface portions are disposed from portions provided with the inner electrode layers 18, 19 to inner portions of the piezoelectric/electrostrictive layers 14 on the side of the peripheral surface of the laminated piezoelectric/electrostrictive device 1. FIGS. 6 and 7, and 8 and 9 are diagrams showing the sections including the inner electrode layers, and the diagrams correspond to diagrams in which the interfaces including the interfaces 2a, 2b are viewed from the side of the piezoelectric/electrostrictive layers 14. The interface portions will be described with reference to these figures. According to FIGS. 6 and 7, and 8 and 9, a strong interface portion 3 is divided from a weak interface portion 4 by a boundary line 5 (shown by a dotted line). It is seen from each figure that the weak interface portion 4 is disposed from the portion provided with the inner electrode layer 18, 19 to the inner portion of the piezoelectric/electrostrictive layer 14 on the side of the peripheral surface of the laminated piezoelectric/electrostrictive device 1.

The embodiment of the laminated piezoelectric/electrostrictive device in the present invention has been described above. Next, there will be described Equations (1) and (2) which define the specific interval for disposing the interfaces having the relatively low interface strength as compared with the other interfaces. In the laminated piezoelectric/electrostrictive device of the present invention, among the interfaces between the layers of the laminated columnar article, the interfaces having the relatively low interface strength as compared with the other interfaces are arranged at the specific interval. This specific interval is disposed so that the number n of the piezoelectric/electrostrictive layers sandwiched between the weak interfaces satisfies Equations (1) and (2) described above, and Equations (1) and (2) are equations derived by analyzing a phenomenon as a problem generated in the laminated piezoelectric/electrostrictive device.

According to investigation of the present applicant, when the laminated piezoelectric/electrostrictive device having a trouble generated therein is investigated, in many cases, a crack is generated from a start point in the vicinity of the boundary between the active portion and the inactive portion of the interface between the inner electrode layer and the piezoelectric/electrostrictive layer. The crack is developed along the interface in the inactive portion, and the crack is developed in an arbitrary direction in the active portion. Furthermore, a plurality of cracks are generated at equal intervals in the laminating direction. From this fact, the present applicant has found that an interaction between the layers works in the laminated piezoelectric/electrostrictive device, and a generated stress increases with an increase of the number n of the piezoelectric/electrostrictive layers. That is, the strain (stress) generated in a certain piezoelectric/electrostrictive layer is generated by accumulation of the strain (stress) of the adjacent piezoelectric/electrostrictive layer. It can also be inferred that the certain piezoelectric/electrostrictive layer is not influenced by a piezoelectric/electrostrictive layer which is sufficiently distant from the certain piezoelectric/electrostrictive layer. This idea meets the Saint Venant's principle that when a rod-like structure is pulled in a length direction, stress distribution in a place sufficiently distant from an end portion does not depend on application of a load to the end portion (with the proviso that there is not any difference between a combined force and a combined moment). At this time, in a case where one weak interface is necessarily disposed in an influential range, the generated stress can be reduced as compared with a case where any weak interface is not disposed. When the weak interface is disposed to divide a structure into blocks, it is possible to obtain an effect that the number of the layers of the structure is small in respect of the stress. Moreover, in the range which can be influenced by the certain piezoelectric/electrostrictive layer as a reference, assuming that a thickness t (μm) of the one piezoelectric/electrostrictive layer is constant, the strain can be defined by a length of the laminated piezoelectric/electrostrictive device represented by n×t and a thickness l (μm) of the laminated columnar article.

It is to be noted that an original cause for the generation of the strain in the laminated piezoelectric/electrostrictive device is that the active portion and the inactive portion interact with each other. The strain generated by this interaction is accumulated in the multilayered structure, and results in the generation of the cracks. As a result of analysis of a state of the laminated piezoelectric/electrostrictive device when driven, in a case where an applied voltage V (V) is applied between the inner electrode layers, there occurs an action that the active portion pulls the inactive portion. Moreover, there also occurs an action that the inactive portion is to compress the active portion, and a balance is attained. In the laminated piezoelectric/electrostrictive device, factors for the generation of the inner stress include both the interaction between the active portion and the inactive portion and the interaction between the layers. These interactions are not independent phenomena, and the latter is generated by the presence of the former.

Figure 11:
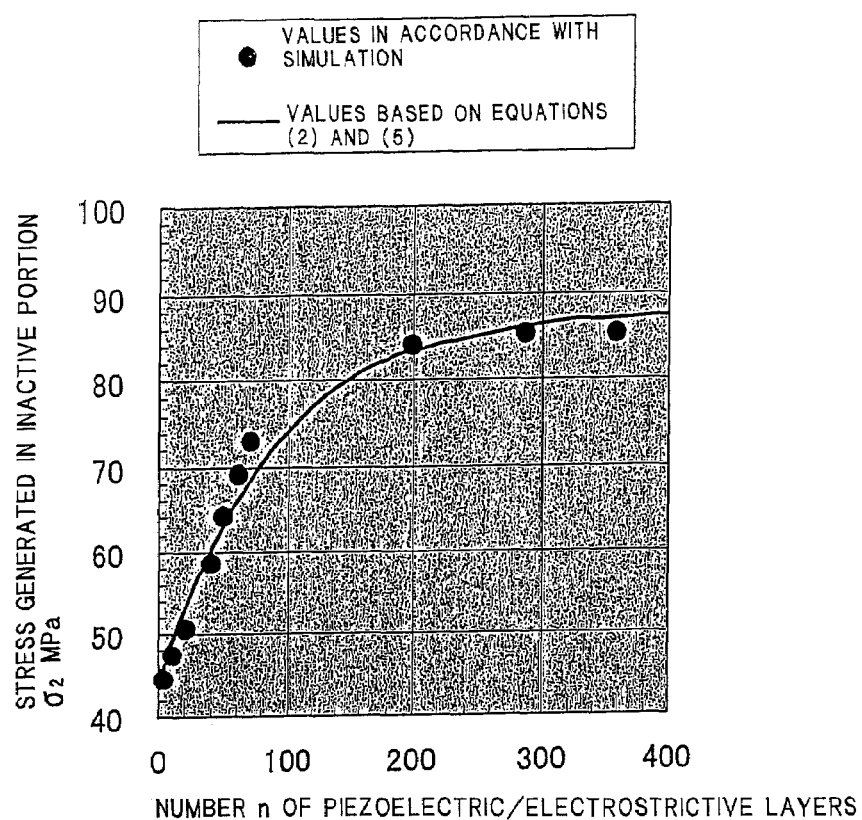
FIG. 11 is a graph showing a curve obtained by calculating a relation between the number n of piezoelectric/electrostrictive layers and a stress $\sigma_2$ generated in an inactive portion based on Equations (2) and (5), the graph being constituted by plotting simulation results.

Here, when the number n of the layers is sufficiently large (a region where a curve of FIG. 11 is flat), a region of the active portion which influences the boundary between the active portion and the inactive portion becomes sufficiently large. That is, a region of the active portion distant from the boundary between the active portion and the inactive portion in a thickness direction of the device also influences the stress distribution in the vicinity of the boundary between the active portion and the inactive portion. Accordingly, the action that the active portion pulls the inactive portion is much more dominant than the action that the inactive portion compresses the active portion. In the above-described balance, a stress $\sigma_2$ (MPa) generated in the inactive portion is much larger than a stress $\sigma_1$ (MPa) generated in the active portion. That is, the strain is generated in the inactive portion, and is hardly generated in the active portion. Therefore, the stress $\sigma_1$ may be regarded as zero (0). Here, a maximum value $\sigma_{2MAX}$ (MPa) of the stress generated in the inactive portion is obtained by the following equation (3):

$$\sigma_{2max} = E \cdot d_{33} V/t \qquad (3)$$

wherein E is the Young's modulus (MPa) of the piezoelectric/electrostrictive material, $d_{33}$ is a piezoelectric/electrostrictive constant (μm/V), V is the applied voltage, and t is the thickness (μm) of one piezoelectric/electrostrictive layer.

Next, there is considered a case where the stress $\sigma_2$ generated in the inactive portion indicates a minimum value $\sigma_{2MIN}$ (MPa). This is a case where there is one piezoelectric/electrostrictive layer (n=1), there is not any interaction between the layers described above, and the only interaction between the active portion and the inactive portion works. In this case, the only piezoelectric/electrostrictive layer portion in the vicinity of the boundary between the active portion and the inactive portion in a direction (direction parallel to the interface) of a width approximately equal to the thickness contributes to the interaction between the active portion and the inactive portion. Moreover, in this case, the action that the active portion pulls the inactive portion and the action that the inactive portion is to compress the active portion may be considered to break even. An absolute value of the stress $\sigma_1$ (compressive stress) generated in the active portion is equal to that of the stress $\sigma_2$ (tensile stress) generated in the inactive portion, and this can be regarded as the minimum value $\sigma_{2MIN}$ of the stress generated in the inactive portion. Therefore, the following equation (4) is derived.

$$\sigma_1 = \sigma_2 = \frac{1}{2} E \cdot d_{33} \cdot V/t = \sigma_{2\min} \quad (4)$$

As described above, in the range which can be influenced by the certain piezoelectric/electrostrictive layer, assuming that the thickness t (μm) of the one piezoelectric/electrostrictive layer is constant, the strain can be defined by the length n×t of the laminated piezoelectric/electrostrictive device and the thickness l (μm) of the laminated columnar article. Therefore, assuming that the thickness l of the laminated columnar article is constant, the following equation (5) is derived as an approximate equation from Equations (3) and (4) described above. It is to be noted that from Equations (3) and (4), $\sigma_{2MAX}=2\times\sigma_{2MIN}$. In the laminated piezoelectric/electrostrictive device 1 described above, since a section horizontal in the axial direction of the laminated columnar article 10 is substantially a square, a length of one side of the square can be employed as the thickness l of the laminated columnar article.

$$\sigma_2 = (\sigma_{2\max} - \sigma_{2\min}) \cdot \left\{1 - \exp\left(-\frac{nt}{l}\right)\right\} + \sigma_{2\min} \quad (5)$$

$$= \sigma_{2\min} \cdot \left\{1 - \exp\left(-\frac{nt}{l}\right)\right\} + \sigma_{2\min}$$

$$= \sigma_{2\min} \cdot \left\{2 - \exp\left(-\frac{nt}{l}\right)\right\}$$

Moreover, in a case where the stress is generated in the laminated piezoelectric/electrostrictive device, when the stress reaches a breaking strength $\sigma_f$ (MPa) as a stress at a time when one block is broken in the piezoelectric/electrostrictive layer or the strong interface, the cracks could be generated in the piezoelectric/electrostrictive layer or the strong interface. Therefore, in a portion other than the weak interface, the stress is prevented from reaching the breaking strength $\sigma_f$. This means that the number n of the piezoelectric/electrostrictive layers in one block may be obtained so that the stress $\sigma_2$ generated in the inactive portion is smaller than the breaking strength $\sigma_f$. Therefore, when n is obtained by Equation (5) so as to establish $\sigma_2<\sigma_f$, Equation (1) described above can be obtained. The laminated piezoelectric/electrostrictive device is constituted of a plurality of materials such as the piezoelectric/electrostrictive article and the inner electrode layer, but the cracks which raise a problem are only developed in the piezoelectric/electrostrictive layers. Therefore, the breaking strength $\sigma_f$ to be considered here is a bending strength of the piezoelectric/electrostrictive layer or the interface strength of the strong interface. The development direction of the cracks generated in the piezoelectric/electrostrictive layer cannot be controlled, and the cracks generated in the strong interface might be developed into the piezoelectric/electrostrictive layer. It is to be noted that Equation (2) is derived from Equation (4).

FIG. 11 is a graph showing a curve obtained by calculating a relation between the number n of the piezoelectric/electrostrictive layers and the stress $\sigma_2$ (MPa) generated in the inactive portion based on Equations (2) and (5) in a case where an applied voltage of 200 V is applied to the laminated piezoelectric/electrostrictive device in which the Young's modulus E of the piezoelectric/electrostrictive material constituting the piezoelectric/electrostrictive layers is 60000 MPa, the piezoelectric/electrostrictive constant $d_{33}$ is 0.0006 μm/V, the thickness t of the one piezoelectric/electrostrictive layer is 82 μm, and the thickness l of the laminated columnar article is 7000 μm. In FIG. 11, there are also plotted results (values of $\sigma_2$) of the stress $\sigma_2$ (MPa) generated in the inactive portion. The stress is obtained using FEM simulation software Stress Check 7 (manufactured by ADA Co., Ltd., developed by ESRD Co., Ltd. (U.S.)). Since the result (plot) of the simulation substantially agrees with the calculation result (curve) based on Equations (2) and (5), it can be presumed that the stress $\sigma_2$ (MPa) generated in the inactive portion is correctly obtained based on Equations (2) and (5).

Figure 12:
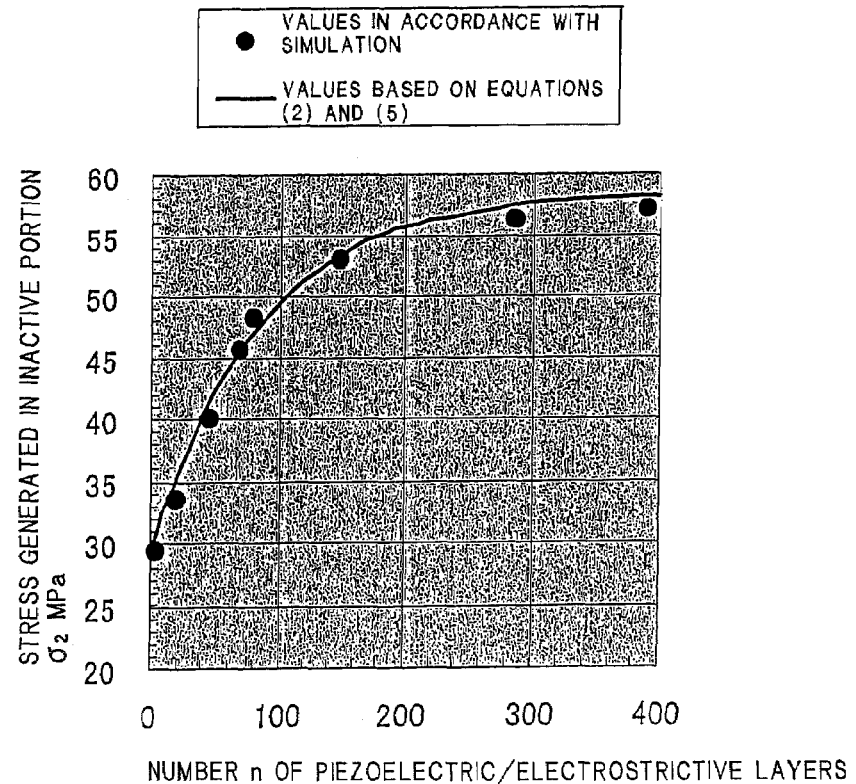
FIG. 12 is a graph showing a curve obtained by calculating the relation between the number n of the piezoelectric/electrostrictive layers and the stress $\sigma_2$ generated in the inactive portion based on Equations (2) and (5), the graph being constituted by plotting the simulation results.

Moreover, FIG. 12 is a graph showing a curve obtained by calculating the relation between the number n of the piezoelectric/electrostrictive layers and the stress $\sigma_2$ (MPa) generated in the inactive portion based on Equations (2) and (5), in a case where the respective values of Equations (1) and (2) are equal to those of the above example except that the Young's modulus E of the piezoelectric/electrostrictive material constituting the piezoelectric/electrostrictive layers is set to 40000 MPa, and an applied voltage of 200 V is similarly applied to the laminated piezoelectric/electrostrictive device having the same shape. In FIG. 12, there are also plotted results (values of $\sigma_2$) of the stress $\sigma_2$ (MPa) generated in the inactive portion. The stress is obtained using FEM simulation software Stress Check 7 in the same manner as described above. Since the result (plot) of the simulation substantially agrees with the calculation result (curve) based on Equations (2) and (5) even in FIG. 12, it can be presumed that the stress $\sigma_2$ (MPa) generated in the inactive portion is correctly obtained based on Equations (2) and (5).

In the laminated piezoelectric/electrostrictive device in which the Young's modulus E is 60000 MPa, $\sigma_{2MIN}=43.9$ MPa results from Equation (2). Moreover, when the breaking strength $\sigma_f$ the piezoelectric/electrostrictive layer is, for example, 70 MPa, n<77.1 layers is obtained from Equation (1). This means that when the number of the piezoelectric/electrostrictive layers is 77 or less, the stress $\sigma_2$ generated in the inactive portion is not above the breaking strength $\sigma_f$ of the piezoelectric/electrostrictive layer, and any crack is not generated in the inactive portion. Therefore, in a case where the interfaces having the relatively low interface strength as compared with the other interfaces (strong interfaces in one block) are disposed in such an interval (specific interval) that 77 or less layers are present in one block, even when the cracks are generated, they are necessarily generated in the weak interfaces. The cracks which break the piezoelectric/electrostrictive layers or which range across the piezoelectric/electrostrictive layers are not easily generated. Similarly, in the laminated piezoelectric/electrostrictive device in which the Young's modulus E is 40000 MPa, $\sigma_{2MIN}=29.3$ MPa results from Equation (2). Moreover, when the breaking strength $\sigma_f$ of the piezoelectric/electrostrictive layer is, for example, 52 MPa, n<128.1 layers is obtained from Equation (1).

Next, there will be described a method of manufacturing the laminated piezoelectric/electrostrictive device of the present invention as well as materials for use. When the laminated piezoelectric/electrostrictive device is manufactured in the present invention, it is preferable to use a green sheet laminating method. FIGS. 10(a) to 10(d) are explanatory views showing one example of steps of manufacturing the laminated piezoelectric/electrostrictive device in the present invention. The laminated piezoelectric/electrostrictive device 1 shown in FIGS. 1 to 7 described above is manufactured as a preparation object by use of the green sheet laminating method.

First, the predetermined number of ceramic green sheets 116 (hereinafter referred to also as the green sheets or the sheets) are prepared which are mainly composed of a piezoelectric/electrostrictive material. The sheets 116 constitute the piezoelectric/electrostrictive layers later. The sheets 116 can be prepared by a ceramic green sheet manufacturing method known heretofore. For example, a powder of the piezoelectric/electrostrictive material is prepared, and this powder is blended with an organic resin (binder), a solvent, a dispersant, a plasticizer, a pore former and the like so as to obtain a desired composition, thereby preparing a slurry. After a defoaming treatment of this slurry, the slurry is formed by a tape forming process such as a doctor blade process, a reverse roll coater process or a reverse doctor roll coater process, and the resultant tape can appropriately be cut to prepare the sheets 116 (see FIG. 10(*a*)).

There is not any restriction on the piezoelectric/electrostrictive material as long as the material causes an electric field induced strain. The material may be crystalline or amorphous, or a semiconductor ceramic material, a ferroelectric ceramic material or an antiferroelectric ceramic material may be used. The material may appropriately be selected and employed in accordance with an application. The material may or may not require a polarizing treatment.

Typical examples of a preferable material include lead zirconate, lead titanate, lead magnesium niobate, lead nickel niobate, lead nickel tantalate, lead zinc niobate, lead manganese niobate, lead antimony stannate, lead manganese tungstate, lead cobalt niobate, lead magnesium tungstate, lead magnesium tantalate, barium titanate, sodium bismuth titanate, bismuth neodymium titanate (BNT), sodium niobate, potassium sodium niobate, strontium bismuth tantalate, copper tungsten barium, bismuth ferrate, and a composite oxide of two or more of them. In these materials, there may be dissolved an oxide of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, copper or the like. Above all, the preferable material is a material mainly composed of the composite oxide of lead zirconate, lead titanate and lead magnesium niobate and containing nickel oxide, or a material mainly composed of the composite oxide of lead zirconate, lead titanate, lead magnesium niobate and lead nickel niobate, because a large electric field induced strain can be utilized. In this case, it is especially preferable that the material contains 0.05 to 3 mass % of nickel components in terms of an oxide. A material obtained by adding lithium bismuthate, lead germanate or the like to any of the above-described materials is preferable because it is possible to develop a high material characteristic while realizing the firing of the piezoelectric/electrostrictive layers at a low temperature. Especially preferable is the material mainly composed of the composite oxide of lead zirconate, lead titanate and lead magnesium niobate and containing nickel oxide, or the material mainly composed of the composite oxide of lead zirconate, lead titanate, lead magnesium niobate and lead nickel niobate, containing 0.05 to 3 mass % of nickel components in terms of the oxide and containing 0.3 to 4 mass % of added lead germanate.

Next, when the predetermined number of the sheets 116 are prepared, one sheet is excluded, and on the surfaces of a half of the other sheets 116, conductive films 48 having a predetermined pattern (electrode pattern) are formed using a conductive material to obtain sheets 118. Similarly, on the surfaces of the other half of the sheets 116, conductive films 49 having a predetermined pattern (electrode pattern) are formed using a conductive material to obtain sheets 119 (see FIG. 10(*b*)). The conductive films 48, 49 constitute later the inner electrode layers 18, 19 (signal electrodes and common electrodes, see FIGS. 4 to 7).

As means for forming the conductive films 48, 49, a screen printing process is preferably used, but means such as photolithography, transfer or stamping may be performed. As the conductive material for use, a metal which is solid at room temperature is employed. It is preferable to use: a single metal such as aluminum, titanium, chromium, iron, cobalt, nickel, copper, zinc, niobium, molybdenum, ruthenium, palladium, rhodium, silver, tin, tantalum, tungsten, iridium, platinum, gold or lead; an alloy made of two or more of them, such as silver-platinum, platinum-palladium or silver-palladium; or a combination of two or more of these alloys. There may be used a mixture of any of the above-described materials with aluminum oxide, zirconium oxide, titanium oxide, silicon oxide, cerium oxide, glass, the piezoelectric/electrostrictive material or the like, or cermet. The material is selected from them depending on whether or not the material is to be fired simultaneously with the piezoelectric/electrostrictive layers. Since the inner electrode layers are fired simultaneously with the piezoelectric/electrostrictive layers, it is necessary to use a high-melting metal which does not change even at a firing temperature of the piezoelectric/electrostrictive layers such as platinum, palladium, a platinum-palladium alloy or a silver-palladium alloy in the inner electrode layers. On the other hand, since the conductive films constituting later the outer electrodes described later can be fired at the low temperature, it is possible to use aluminum, gold, silver, a silver-palladium alloy or the like in the films. In addition, a very large displacement has to be sometimes generated depending on the application. Alternatively, to prevent the outer electrodes from being disconnected even if the cracks are generated in the weak interfaces, foils, plates or the like constituted of a conductive material having an excellent ductility for combined use may separately be mounted on the formed electrodes.

Here, when the second weak interface forming means is employed to dispose the interfaces having the relatively low interface strength as compared with the other interfaces, a material of an only metal is used as the conductive material to form the weak interfaces, a cermet material is used as the conductive material to form the other strong interface, and these materials need to be selectively used.

Moreover, when the first weak interface forming means is employed to dispose the interfaces having the relatively low interface strength as compared with the other interfaces, there is changed a composition of a raw material of the only green sheets constituting the piezoelectric/electrostrictive layers whose density is to be reduced. Alternatively, there is changed a composition of a raw material of the only conductive films constituting the inner electrode layers whose density is to be reduced. The density of the green sheets can be reduced by increasing an amount of the pore former, or adjusting a particle size of the powder of the piezoelectric/electrostrictive material, when the slurry is prepared. When the conductive films are formed by, for example, the screen printing process, the density of the conductive films can be reduced by increasing the amount of the pore former of a conductive material paste for use, or adjusting the particle size of a conductive material powder.

Next, the sheet 116 on which any conductive film is not formed is constituted as the uppermost surface, and the predetermined number of the sheets 118, 119 on which the conductive films 48, 49 constituting later the inner electrode layers 18, 19 have been formed are laminated and attached to one another under pressure to obtain a laminated green article (see FIG. 10(*c*)). Thereafter, the laminated green article is fired to obtain an integrated laminated and fired article, and corners of the peripheral surface of the article are chamfered by work means such as dicing or slicing. It is to be noted that the chamfering may be performed before the firing. Alternatively, in a case where the sheets 118, 119 on which the conductive films 48, 49 constituting later the inner electrode layers 18, 19 have been formed are laminated and attached to one another under pressure to obtain the laminated green article, the sheets 118, 119 can be punched using a punching machine while laminating the sheets on a punch as a laminating shaft of the punching machine. This method is referred to as a simultaneous punching and laminating process, and detailed preparations, procedures and the like conform to those of a method disclosed in Patent Document 4. When the laminated piezoelectric/electrostrictive device is manufactured by the steps of obtaining the laminated green article by use of the simultaneous punching and laminating process, the sheets can be positioned with a satisfactory precision, and the laminated layers do not deviate from one another.

In a case where the third weak interface forming means is employed to dispose the interfaces having the relatively low interface strength as compared with the other interfaces, when the sheets are laminated and attached to one another under pressure to obtain the laminated green article, an adhesive is used in which a material blended with the piezoelectric/electrostrictive material of the same ceramic as that of the green sheets is used and which disappears later. Moreover, there is increased or decreased the content of the binder in the only adhesive for use in bonding to one another the sheets constituting the piezoelectric/electrostrictive layers on which the weak interfaces are to be formed. It is to be noted that the piezoelectric/electrostrictive material of the ceramic in the adhesive does not disappear, and constitutes a part of the piezoelectric/electrostrictive layers.

According to the above-described laminating, firing and working steps, the laminated columnar article 10 (see FIGS. 4 to 7) is obtained in which the piezoelectric/electrostrictive layers 14 and the inner electrode layers 18, 19 are alternately laminated. Moreover, the conductive films are formed on the peripheral surface of the laminated columnar article 10 parallel to the axial direction, and fired to dispose a pair of outer electrodes 28, 29. Accordingly, the laminated piezoelectric/electrostrictive device 1 can be obtained (see FIG. 10(d)).

It is to be noted that in the above-described laminating and firing steps, the laminated green article is preferably obtained using the simultaneous punching and laminating process, the laminated green article is fired, and the integrated laminated and fired article is obtained. When the fourth weak interface forming means is employed to dispose the interfaces having the relatively low interface strength as compared with the other interfaces, instead of performing the firing in the last step, the firing is performed at an arbitrary timing a plurality of times to obtain the laminated columnar article 10. Moreover, during the firing performed the plurality of times, when the sheets constituting the piezoelectric/electrostrictive layers to form the weak interfaces or the conductive films constituting the inner electrode layers to form the weak interfaces are fired, a firing temperature is set to be lower than that in the other firing so as to prevent the sintering from being sufficiently performed. It is to be noted that in this case, since the sheets need to be removed from the punching machine (punch) and fired before obtaining the laminated columnar article 10, the simultaneous punching and laminating process cannot be employed.

Moreover, when the fifth weak interface forming means is employed to dispose the interfaces having the relatively low interface strength as compared with the other interfaces, there is not any restriction on manufacturing steps and firing timings. The laminated columnar article 10 may be obtained by the steps of obtaining the laminated green article and firing the laminated green article to obtain the integrated laminated and fired article, or the laminated columnar article 10 may be obtained by performing the firing at the arbitrary timing the plurality of times.

Finally, to enhance a resistance to humidity and an insulating property of the laminated piezoelectric/electrostrictive device 1, it is preferable to apply a resin coating. Examples of a resin material for use in the resin coating include a polyfluoroethylene-based material, an acrylic material, an epoxy-based material, a polyimide-based material and a silicone-based material. Under a high environmental load of a fuel jet device or the like, it is preferable to use the polyfluoroethylene-based material, the polyimide-based material, a composite material of them, or a composite material of, for example, the polyfluoroethylene-based (PTFE) material and polyamide imide.

It is to be noted that in the laminated piezoelectric/electrostrictive device of the present invention and the method of manufacturing the device described above, to facilitate understanding of the description, a case where one device is prepared alone has been described. In actual, needless to say, conductive films for a large number of devices can be formed (printed) on the green sheets to easily obtain a large number of devices by performing an individually dividing step after the laminating and firing steps.

Figure 13:
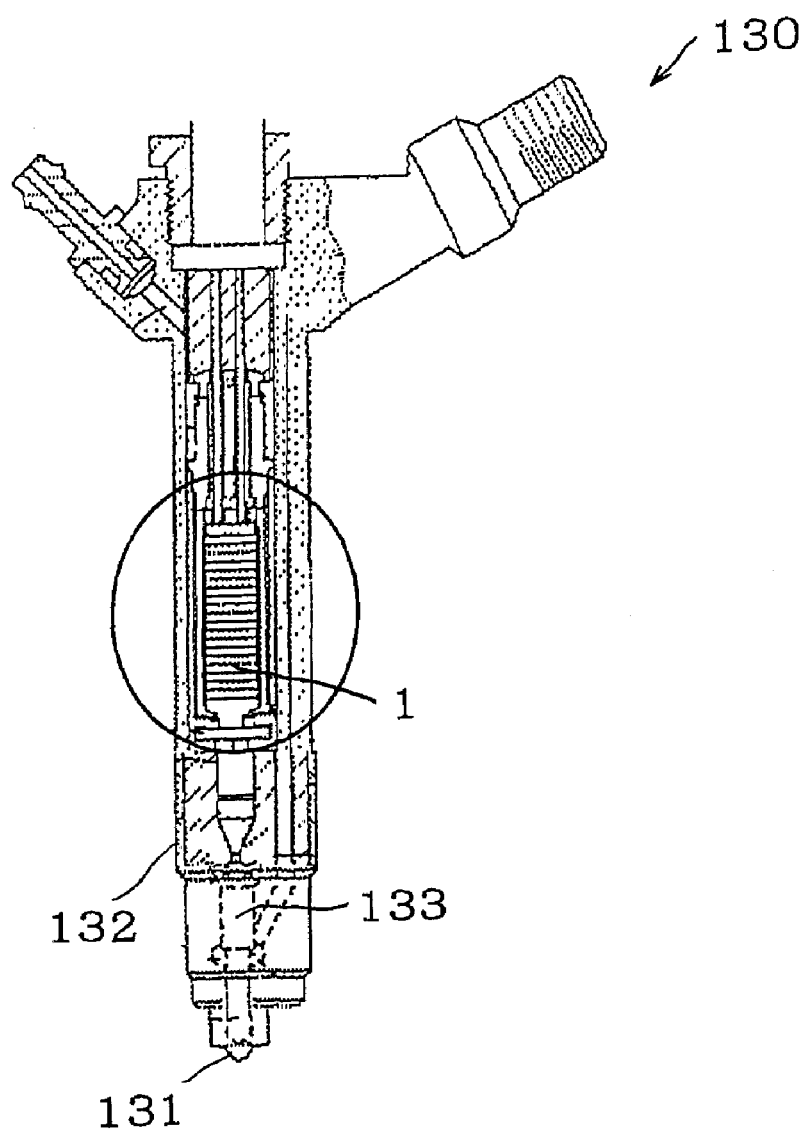
FIG. 13 is a sectional view showing one example of a fuel jet device of an internal combustion engine.

There have been described the laminated piezoelectric/electrostrictive device of the present invention and the method of manufacturing the device. The laminated piezoelectric/electrostrictive device of the present invention is used as a preferable driving source of an opening/closing mechanism of a jet nozzle in a fuel jet device of an internal combustion engine. Here, FIG. 13 shows one example of the fuel jet device of the internal combustion engine. FIG. 13 is a sectional view. As shown in FIG. 13, a fuel jet device 130 of the internal combustion engine includes: a container 132 having a jet nozzle 131; an opening/closing mechanism 133 which opens and closes the jet nozzle 131 of the container 132; and the laminated piezoelectric/electrostrictive device 1 contained as the driving source of the opening/closing mechanism 133 in the container 132.

A high-pressure fuel flows from a common rail (not shown in FIG. 13) into the fuel jet device 130 via a fuel inlet, and is jetted from the jet nozzle 131 into the cylinder of the engine (not shown in FIG. 13). The laminated piezoelectric/electrostrictive device 1 is contained in an encircled portion of the fuel jet device 130 in FIG. 13. For example, a needle valve is moved by expansion/contraction displacement of the laminated piezoelectric/electrostrictive device to open or close the jet nozzle 131, whereby the jetting of the high-pressure fuel is controlled. As described above, the laminated piezoelectric/electrostrictive device 1 can realize the high-speed opening/closing of the jet nozzle 131 stably over a long period, and the optimum amount of the fuel can be fed into the cylinder. Therefore, in the fuel jet device 130 in which the laminated piezoelectric/electrostrictive device 1 is utilized, it is possible to reduce harmful substances such as particulates included in a gas discharged from the engine stably over the long period.

A laminated piezoelectric/electrostrictive device of the present invention is usable as a micro actuator in any application. The device is especially preferably utilized in the application which requires a large displacement amount in the actuator. Specifically, the laminated piezoelectric/electrostrictive device of the present invention is usable as a driving source of an opening/closing mechanism of a jet nozzle in a fuel jet device of an internal combustion engine such as a diesel engine, or a driving source of a device requiring precise positioning such as an optical device, a vibration preventive device or the like.

What is claimed is:

1. A laminated piezoelectric/electrostrictive device having: a laminated columnar article constituted by alternately laminating a plurality of piezoelectric/electrostrictive layers and inner electrode layers; and a pair of outer electrodes disposed on a peripheral surface of the laminated columnar article, each of the outer electrodes being configured to connect the inner electrode layers having the same polarity to each other among the plurality of inner electrode layers, wherein among interfaces between piezoelectric/electrostrictive layers and inner electrode layers of the laminated columnar article, interfaces having a relatively low interface strength as compared with the other interfaces are arranged at a specific interval.

2. The laminated piezoelectric/electrostrictive device according to claim 1, wherein the specific interval satisfies the following equations (1) and (2):

$$n < \frac{1}{t} \cdot \ln\left(\frac{\sigma_{2min}}{2 \cdot \sigma_{2min} - \sigma_f}\right) \text{ and} \quad (1)$$

$$\sigma_{2min} = \frac{E \cdot d_{33} \cdot V}{2t} \quad (2)$$

in which t is a thickness (μm) of the one piezoelectric/electrostrictive layer, n is the number of the piezoelectric/electrostrictive layers which are present in the specific interval, l is a thickness (μm) of the laminated columnar article, $\sigma_f$ is a breaking strength (MPa) of one block present in the specific interval, E is the Young's modulus (MPa) of a piezoelectric/electrostrictive material constituting the piezoelectric/electrostrictive layers, $d_{33}$ is a piezoelectric/electrostrictive constant (μm/V) of the piezoelectric/electrostrictive material constituting the piezoelectric/electrostrictive layers, and V is an applied voltage (V), respectively; the thickness t of the one piezoelectric/electrostrictive layer and the thickness l of the laminated columnar article are constant, and the block is a portion sandwiched between two interfaces having the relatively low interface strength in the laminated piezoelectric/electrostrictive device, or a portion on the uppermost or lowermost side of one interface having the relatively low interface strength on the uppermost or lowermost side of the laminated piezoelectric/electrostrictive device.

3. The laminated piezoelectric/electrostrictive device according to claim 1, wherein in a case where a portion having a relatively high interface strength and a portion having a relatively low interface strength are further present in the interface having a relatively low interface strength as compared with the other interfaces, the portion having the relatively low interface strength is disposed from a portion provided with the inner electrode layer to an inner portion of the piezoelectric/electrostrictive layer on the side of the peripheral surface of the laminated piezoelectric/electrostrictive device.

4. The laminated piezoelectric/electrostrictive device according to claim 1, wherein among the piezoelectric/electrostrictive layers and the inner electrode layers constituting the laminated columnar article, a density of a part of the piezoelectric/electrostrictive layers or the inner electrode layers is smaller than that of the other piezoelectric/electrostrictive layers or the other inner electrode layers, and the interfaces having the relatively low interface strength as compared with the other interfaces are formed from the piezoelectric/electrostrictive layers or the inner electrode layers having the small density.

5. The laminated piezoelectric/electrostrictive device according to claim 1, wherein a part of the inner electrode layers constituting the laminated columnar article is formed of a material of an only metal, the other inner electrode layers are formed of a cermet material, and the interfaces having the relatively low interface strength as compared with the other interfaces are formed from the inner electrode layers formed of the material of the only metal.

6. The laminated piezoelectric/electrostrictive device according to claim 1, which is prepared by the steps of:
forming electrode patterns constituted of a conductive material and constituting later the inner electrode layers on a plurality of green sheets mainly composed of the piezoelectric/electrostrictive material and constituting the piezoelectric/electrostrictive layers later:
laminating the plurality of green sheets having the electrode patterns formed thereon to obtain a laminated green article; and
firing the laminated green article to obtain the laminated columnar article.

7. The laminated piezoelectric/electrostrictive device according to claim 6, wherein the laminated green article is obtained using a punching machine, and the green sheets having the electrode patterns formed thereon are punched while laminating the green sheets on a punch as a laminating shaft of the punching machine.

8. The laminated piezoelectric/electrostrictive device according to claim 6, wherein when the green sheets having the electrode patterns formed thereon are laminated, a bonding strength between a part of the green sheets is set to be lower than that between the other green sheets, and the interface having the relatively low interface strength as compared with the other interfaces is constituted by the interface between the green sheets between which the bonding strength has been set to be low.

9. The laminated piezoelectric/electrostrictive device according to claim 1, which is prepared by the steps of:
repeatedly forming an electrode pattern constituted of a conductive material and constituting later the inner electrode layer on a green sheet mainly composed of a piezoelectric/electrostrictive material and constituting the piezoelectric/electrostrictive layer later, laminating a new green sheet on the green sheet having the electrode pattern formed thereon, and forming an electrode pattern on the newly laminated green sheet; and
firing the green sheets at an arbitrary timing a plurality of times to obtain the laminated columnar article.

10. The laminated piezoelectric/electrostrictive device according to claim 9, wherein a firing temperature of a part of the firing performed the plurality of times is set to be lower than that of the other firing, or a firing time of a part of the firing is set to be shorter than that of the other firing, and the interfaces having the relatively low interface strength as compared with the other interfaces are formed from the piezoelectric/electrostrictive layers or the inner electrode layers which are not sufficiently sintered owing to the firing at the lowered firing temperature or in the reduced firing time.

11. The laminated piezoelectric/electrostrictive device according to claim 6, which is prepared using, as the piezoelectric/electrostrictive material or the conductive material, at least two types of piezoelectric/electrostrictive materials or conductive materials different from each other in sintering temperature or sintering time, wherein the interfaces having the relatively low interface strength as compared with the other interfaces are formed from the piezoelectric/electrostrictive layers or the inner electrode layers constituted by firing the green sheets or the electrode patterns mainly composed of the piezoelectric/electrostrictive material or the conductive material having a high sintering temperature or a long sintering time in the at least two types of piezoelectric/electrostrictive materials or conductive materials.

12. The laminated piezoelectric/electrostrictive device according to claim 9, which is prepared using, as the piezoelectric/electrostrictive material or the conductive material, at least two types of piezoelectric/electrostrictive materials or conductive materials different from each other in sintering temperature or sintering time, wherein the interfaces having the relatively low interface strength as compared with the other interfaces are formed from the piezoelectric/electrostrictive layers or the inner electrode layers constituted by firing the green sheets or the electrode patterns mainly composed of the piezoelectric/electrostrictive material or the conductive material having a high sintering temperature or a long sintering time in the at least two types of piezoelectric/electrostrictive materials or conductive materials.

13. The laminated piezoelectric/electrostrictive device according to claim 1, wherein cracks are generated in an interfacial direction in the interfaces having the relatively low interface strength as compared with the other interfaces, in a case where the device is polarized or operated.

14. The laminated piezoelectric/electrostrictive device according to claim 1, wherein the laminated columnar article has a regular square pole shape formed by chamfering corners of the peripheral surface of the laminated columnar article.

15. The laminated piezoelectric/electrostrictive device according to claim 1, for use as a driving source of a jet nozzle opening/closing mechanism in a fuel jet device of an internal combustion engine.

\* \* \* \* \*